(12) United States Patent
Garg et al.

(10) Patent No.: US 11,223,354 B2
(45) Date of Patent: Jan. 11, 2022

(54) LOW CURRENT, WIDE RANGE INPUT COMMON MODE LVDS RECEIVER DEVICES AND METHODS

(71) Applicant: STMicroelectronics International N.V., Geneva (CH)

(72) Inventors: Paras Garg, Noida (IN); Ankit Agrawal, Greater Noida (IN); Sandeep Kaushik, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/999,813

(22) Filed: Aug. 21, 2020

(65) Prior Publication Data

US 2021/0067159 A1    Mar. 4, 2021

Related U.S. Application Data

(60) Provisional application No. 62/892,937, filed on Aug. 28, 2019.

(51) Int. Cl.
*H03K 19/0185* (2006.01)
*H03K 17/687* (2006.01)
*H03K 5/24* (2006.01)

(52) U.S. Cl.
CPC ....... *H03K 17/6874* (2013.01); *H03K 5/2481* (2013.01); *H03K 19/0185* (2013.01); *H03K 19/018507* (2013.01)

(58) Field of Classification Search
CPC ....... H03K 17/6874; H03K 19/018507; H03K 19/018521; H03K 5/2481; H03K 19/0175; H03K 19/0185; G06F 3/00
See application file for complete search history.

(56) References Cited

U.S. PATENT DOCUMENTS

| | | |
|---|---|---|
| 6,956,436 B2 | 10/2005 | Li et al. |
| 7,088,166 B1 | 8/2006 | Reinschmidt et al. |
| 7,646,220 B2 | 1/2010 | Wu |

(Continued)

OTHER PUBLICATIONS

Boni et al., "LVDS I/O Interface for GB/s-per-Pin Operation in 0.35-μm CMOS," *IEEE Jounal of Solid-State Circuits* 36(4):706-711, Apr. 2001.

(Continued)

*Primary Examiner* — Jung Kim
(74) *Attorney, Agent, or Firm* — Seed Intellectual Property Law Group LLP

(57) ABSTRACT

Low-voltage differential signaling (LVDS) receiver circuits, electronic devices, and methods are provided. A LVDS receiver includes an input differential pair of transistors that receive a differential input signal. The input differential pair includes a first NMOS transistor that receives a first input signal and a second NMOS transistor that receives a second input signal. A third NMOS transistor has source and drain terminals respectively coupled to source and drain terminals of the first NMOS transistor, and a fourth NMOS transistor has source and drain terminals respectively coupled to source and drain terminals of the second NMOS transistor. A first level shifter is coupled to a gate of the third NMOS transistor, and a second level shifter is coupled to a gate of the fourth NMOS transistor.

20 Claims, 5 Drawing Sheets

(56) References Cited

U.S. PATENT DOCUMENTS

| | | | | |
|---|---|---|---|---|
| 7,750,666 B2* | 7/2010 | Zhang | ................ | H04L 25/0298 |
| | | | | 326/30 |
| 8,625,014 B2* | 1/2014 | Yoo | ..................... | H04N 5/3575 |
| | | | | 348/300 |
| 2014/0368239 A1* | 12/2014 | Suzuki | .......... | H03K 19/018507 |
| | | | | 327/108 |

OTHER PUBLICATIONS

Lee et al., "Design and Implementation of CMOS LVDS 2.5Gb/s Transmitter and 1.3Gb/s Receiver for Optical Interconnections," The 2001 IEEE International Symposium on Circuits and Systems (ISCAS 2001), Sydney, NSW, Australia, May 6-9, 2001, 4 pages.

* cited by examiner

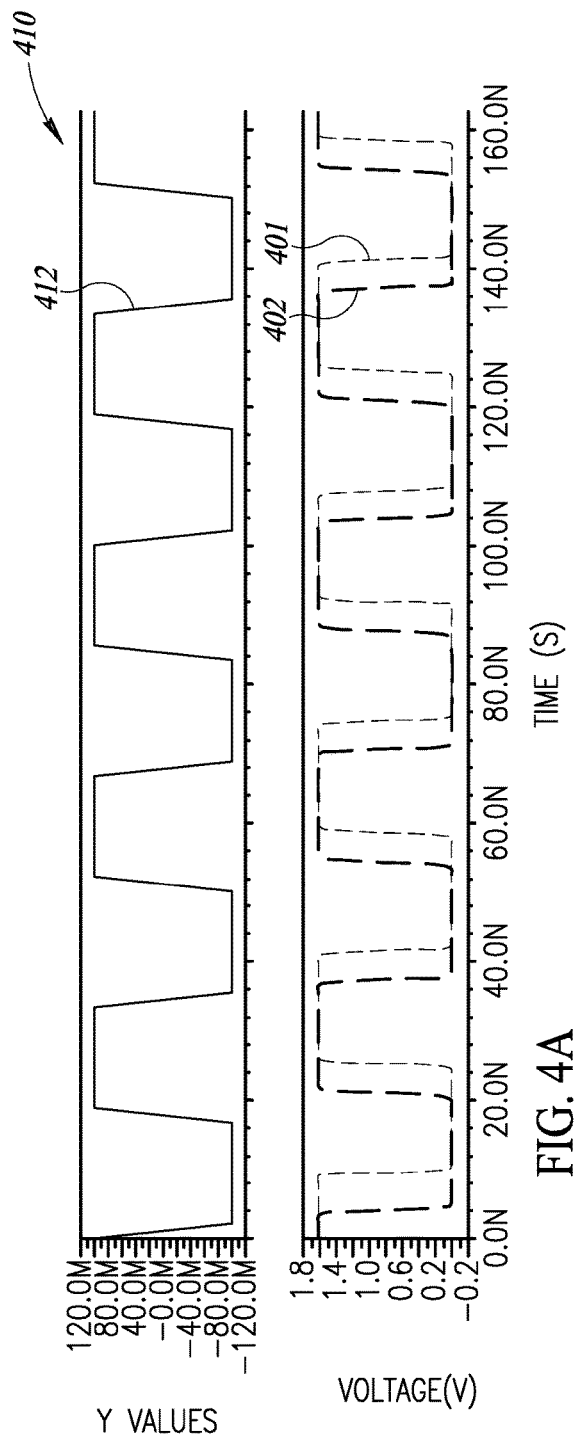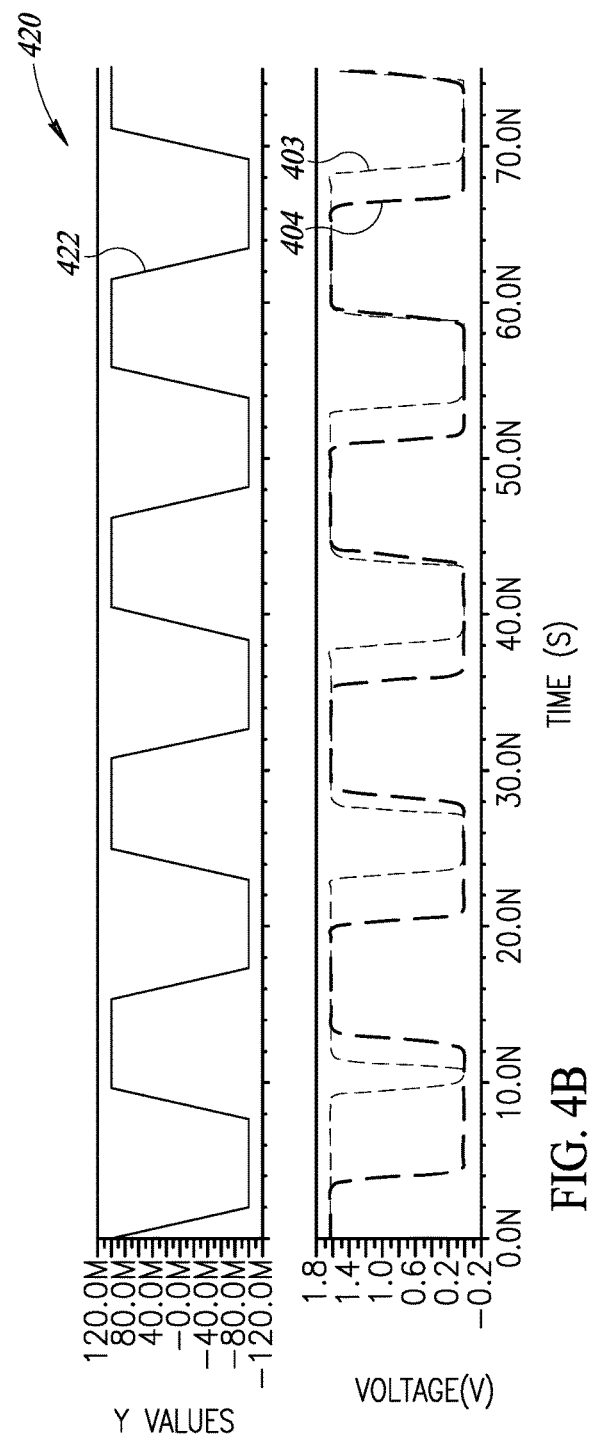
FIG. 4A
FIG. 4B

US 11,223,354 B2

LOW CURRENT, WIDE RANGE INPUT COMMON MODE LVDS RECEIVER DEVICES AND METHODS

BACKGROUND

Technical Field

Embodiments of the present disclosure are generally directed to low-voltage differential signaling (LVDS) receiver circuits, electronic devices, and methods of making LVDS receiver circuits.

Description of the Related Art

Differential drivers and receivers. Differential drivers and receivers are used in integrated circuits (IC) for on-chip communications between circuits, chip-to-board, off-chip communications, etc.

Low-voltage differential signaling (LVDS) receivers are used in many applications such as in communications, video or display technologies, and integrated circuits that may operate based on a high data transfer rate. LVDS signaling generally provides a low-power and low-voltage communication protocol that facilitates high speed data communications.

LVDS typically requires a common mode input voltage that is bounded by the supply voltages. This is often referred to as a rail-to-rail input voltage. In order to meet a specified rail-to-rail common mode input range for an LVDS receiver, exiting architectures generally rely on simple input stages including both NMOS and PMOS input stages and additional circuitry in order to provide a wide input range for the LVDS receiver. However, such existing architectures generally utilize relatively high currents and consume relatively large amounts of power.

BRIEF SUMMARY

In various embodiments, the present disclosure provides low-voltage differential signaling (LVDS) receiver circuits, electronic devices, and methods in which the LVDS receiver can operate with a wide range input common mode utilizing a single NMOS differential transistor pair. The LVDS receiver includes source follower stages or level shifter stages which are used for input to each NMOS in differential pair. The single NMOS differential pair is used for higher input common mode voltages (e.g., a higher range of differential input signals), and the level shifters are used for lower input common mode voltages (e.g., a lower range of differential input signals).

In one embodiment, the present disclosure provides a low-voltage differential signaling (LVDS) receiver that includes an input differential pair of transistors configured to receive a differential input signal. The input differential pair includes a first NMOS transistor configured to receive a first input signal of the differential input signal, and a second NMOS transistor configured to receive a second input signal of the differential input signal. A third NMOS transistor has a source terminal coupled to a source terminal of the first NMOS transistor, and a drain terminal of the third NMOS transistor is coupled to a drain terminal of the first NMOS transistor. A fourth NMOS transistor has a source terminal coupled to a source terminal of the second NMOS transistor, and a drain terminal of the fourth NMOS transistor is coupled to a drain terminal of the second NMOS transistor. A first level shifter is coupled to a gate of the third NMOS transistor, and a second level shifter is coupled to a gate of the fourth NMOS transistor.

In another embodiment, the present disclosure provides an electronic device that includes processing circuitry and a low-voltage differential signaling (LVDS) receiver electrically coupled to the processing circuitry. The LVDS receiver includes an input differential pair of NMOS transistors configured to receive a differential input signal. The input differential pair includes a first NMOS transistor configured to receive a first input signal of the differential input signal, and a second NMOS transistor configured to receive a second input signal of the differential input signal. An additional pair of NMOS transistors is respectively electrically coupled in parallel with the input differential pair of NMOS transistors. A pair of level shifters is respectively coupled to gate terminals of the additional pair of NMOS transistors.

In yet another embodiment, the present disclosure provides a method of manufacturing a low-voltage differential signaling (LVDS) receiver having an input differential pair of transistors configured to receive a differential input signal, and the method includes: electrically coupling a source terminal of a first NMOS transistor of the input differential pair to a source terminal of a third NMOS transistor; electrically coupling a drain terminal of the first NMOS transistor of the input differential pair to a drain terminal of the third NMOS transistor; electrically coupling a source terminal of a second NMOS transistor of the input differential pair to a source terminal of a fourth NMOS transistor; electrically coupling a drain terminal of the second NMOS transistor of the input differential pair to a drain terminal of the fourth NMOS transistor; electrically coupling a first PMOS transistor between a first supply voltage and a gate terminal of the third NMOS transistor; and electrically coupling a second PMOS transistor between the first supply voltage and a gate terminal of the fourth NMOS transistor.

BRIEF DESCRIPTION OF THE SEVERAL VIEWS OF THE DRAWINGS

FIG. 4A is a waveform diagram illustrating performances of the LVDS receiver of FIG. 1 and the LVDS receiver of FIG. 3 at a first frequency, in accordance with one or more embodiments.

FIG. 4B is a waveform diagram illustrating performances of the LVDS receiver of FIG. 1 and the LVDS receiver of FIG. 3 at a second frequency that is different from the first frequency, in accordance with one or more embodiments.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures, circuitry, or the like associated with LVDS receiver circuits have not been shown or described in detail to avoid unnecessarily obscuring descriptions of the various embodiments provided herein.

Unless the context requires otherwise, throughout the specification and claims that follow, the word "comprise" and variations thereof, such as "comprises" and "comprising" are to be construed in an open, inclusive sense, that is, as "including, but not limited to." Further, the terms "first," "second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments of the present disclosure.

As used in the specification and the appended claims, the singular forms "a," "an," and "the" include plural referents unless the context clearly dictates otherwise. It should also be noted that the term "or" is generally employed in its broadest sense, that is, as meaning "and/or" unless the context clearly dictates otherwise.

The present disclosure is generally directed to low-voltage differential signaling (LVDS) receiver circuits, electronic devices, and methods in which the LVDS receiver can operate with a wide range input common mode utilizing a single NMOS differential input transistor pair.

Figure 1:
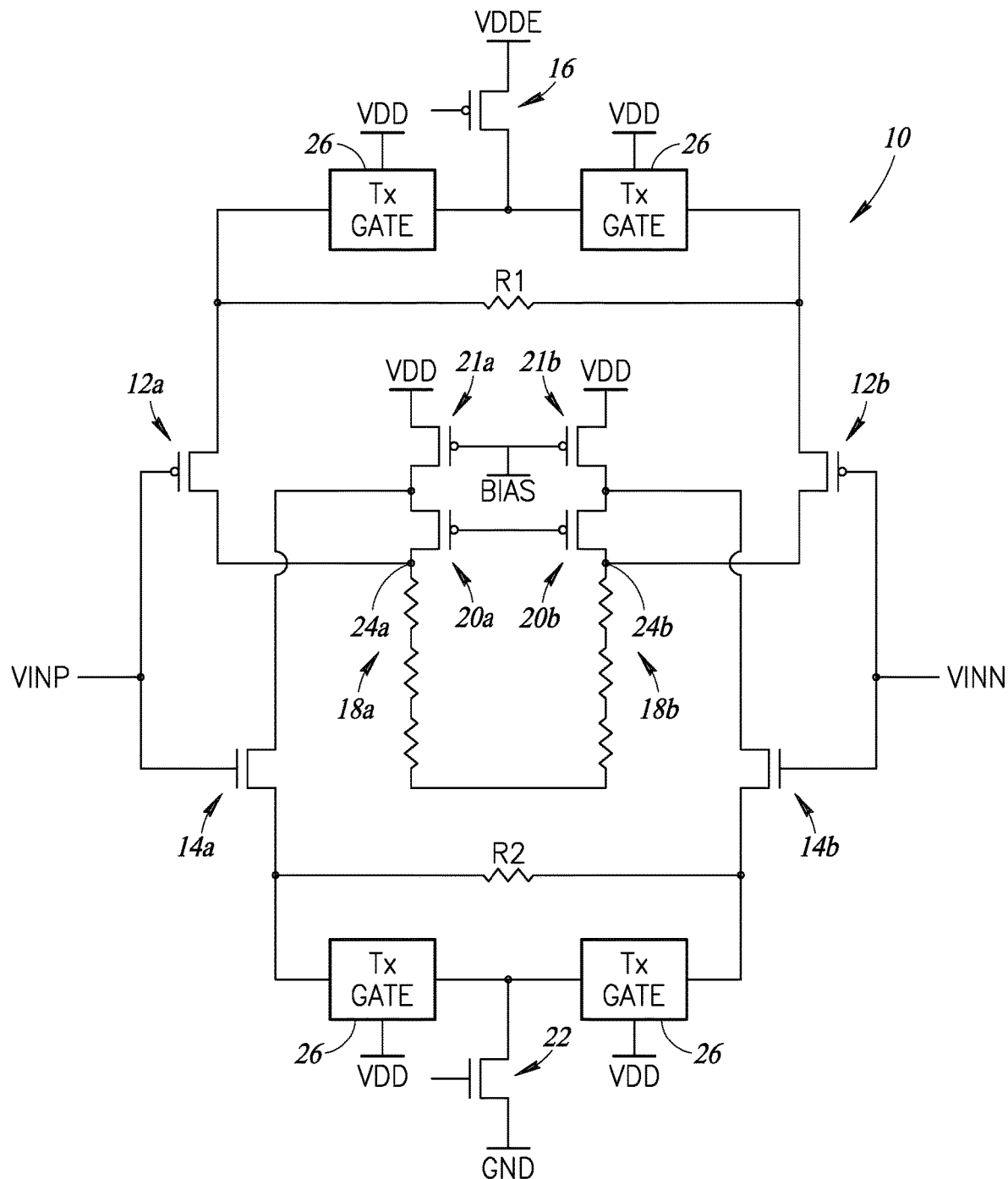
FIG. 1 is a schematic circuit diagram illustrating a first stage of a wide common mode low-voltage differential signaling (LVDS) receiver, in accordance with a comparative example of the present disclosure.

FIG. 1 is a schematic circuit diagram illustrating a first stage of a wide common mode low-voltage differential signaling (LVDS) receiver 10, in accordance with a comparative example of the present disclosure.

The LVDS receiver 10 includes a PMOS differential pair including first and second PMOS transistors 12a, 12b, and an NMOS differential pair including first and second NMOS transistors 14a, 14b. VINP and VINN are two differential inputs to the LVDS receiver 10. The first differential input VINP is provided to gate terminals of the first PMOS transistor 12a and the first NMOS transistor 14a, while the second differential input VINN is provided to gate terminals of the second PMOS transistor 12b and the second NMOS transistor 14b. Accordingly, the first and second PMOS transistors 12a, 12b and the first and second NMOS transistors 14a, 14b may be referred to as input transistors as their gates are connected to the input signals VINP and VINN.

The LVDS receiver 10 includes a first current source 16, which may be a PMOS transistor as shown in FIG. 1. The source terminals of the first and second PMOS transistors 12a, 12b are electrically coupled to the first current source 16 (e.g., to the drain of the PMOS transistor of the first current source 16). The gate of the PMOS transistor of the first current source 16 may be controlled by a first bias voltage, e.g., supplied from a bias generation circuit (not shown), while the source of the PMOS transistor of the first current source 16 may be connected to a first power supply voltage VDDE. The first power supply voltage VDDE may be, for example, an interface or I/O supply voltage, which in some embodiments may be within a range from about 2.4V to about 3.6V.

A resistor R1 may be coupled between the source terminals of the first and second PMOS transistors 12a, 12b. The drain terminals of the first and second PMOS transistors 12a, 12b are electrically coupled to first and second load branches 18a, 18b, for example, through first and second common gate PMOS transistors 20a, 20b, respectively.

The source terminals of the first and second NMOS transistors 14a, 14b are electrically coupled to a second current source 22, which may be an NMOS transistor as shown in FIG. 1. For example, the source terminals of the first and second NMOS transistors 14a, 14b may be electrically coupled to the drain of the NMOS transistor of the second current source 22. The gate of the NMOS transistor of the second current source 22 may be controlled by a second bias voltage, e.g., supplied from the bias generation circuit (not shown), while the source of the NMOS transistor of the second current source 22 may be connected to a second power supply voltage GND, which may be an electrical ground.

A resistor R2 may be coupled between the source terminals of the first and second NMOS transistors 14a, 14b. The drain terminals of the first and second NMOS transistors 14a, 14b are electrically coupled to the first and second load branches 18a, 18b, for example, through the first and second common gate PMOS transistors 20a, 20b, respectively. Current sources 21a, 21b for the load branches, which may be PMOS transistors 21a, 21b, are respectively coupled to source terminals of the first and second common gate PMOS transistors 20a, 20b. The current sources 21a, 21b may be controlled by bias signals generated and supplied by a biasing circuit (not shown).

As shown in FIG. 1, the LVDS receiver 10 includes complementary input stages, i.e., a first PMOS stage including the first and second PMOS transistors 12a, 12b and a second NMOS stage including the first and second NMOS transistors 14a, 14b. By applying complementary stages at the input or first stage of the LVDS receiver 10, the LVDS receiver 10 can accept wide input common voltages.

In operation, the second current source 22 provides a bias current (e.g., in response to the second bias voltage applied to the gate of the NMOS transistor of the second current source 22) to the first and second NMOS transistors 14a, 14b of the NMOS differential pair. The second current source 22 may be used to control the current flow for the NMOS differential pair. Similarly, the first current source 16 provides a bias current (e.g., in response to the first bias voltage applied to the gate of the PMOS transistor of the first current source 16) to the first and second PMOS transistors 12a, 12b of the PMOS differential pair. The first current source 16 may be used to control the current flow for the PMOS differential pair.

A differential output is provided by the LVDS receiver 10 at the differential output nodes 24a, 24b. Since the output is differential, the duty cycle can be better maintained. The output of the LVDS receiver 10 may be provided from the differential output nodes 24a, 24b to additional circuitry, such as a second stage, which may be utilized to provide a full rail-to-rail signal based on the differential output.

Common mode voltage is typically set to a voltage near the middle of the first power supply voltage VDDE. The input range of the LVDS receiver 10 may be limited by the common mode voltage. In a case when the differential inputs VINP, VINN are high (e.g., 2 V-4 V), the NMOS differential pair (i.e., the first and second NMOS transistors 14a, 14b)

may be utilized, as the NMOS differential pair will be ON and the PMOS differential pair will be OFF. Conversely, when the differential inputs VINP, VINN are low, then the PMOS differential pair (i.e., the first and second PMOS transistors 12a, 12b) may be utilized, as the PMOS differential pair will be ON and the NMOS differential pair will be OFF.

The LVDS receiver 10 may therefore utilize the PMOS differential pair for a first range of input voltages (e.g., corresponding to a lower range of input voltages or lower common mode voltages), and may utilize the NMOS differential pair for a second range of input voltages (e.g., corresponding to a higher range of input voltages or higher common mode voltages).

Accordingly, through the use of complementary PMOS and NMOS differential pairs, the LVDS receiver 10 can achieve a wide common mode input voltage range.

The LVDS receiver 10 may further include one or more transmission gates 26 coupled between the first current source 16 and the first and second PMOS transistors 12a, 12b, and coupled between the second current source 22 and the first and second NMOS transistors 14a, 14b. The transmission gates 26 may be utilized to determine a polarity of a hysteresis offset for the LVDS receiver 10. Hysteresis can be useful for noise rejection or preventing high frequency voltage noise in the input from causing erroneous transitions in the output signal. A separate level shifter circuit (not shown) may be included to provide control signals to the transmission gates 26. The separate level shifter circuit is utilized to control the transmission gates 26, and more particularly to control the transmission gates 26 coupled between the first current source 16 and the first and second PMOS transistors 12a, 12b, because a level-shifted signal should be generated at a voltage level sufficient to switch on and off the PMOS transistors 12a, 12b. For example, the separate level shifter circuit is utilized to level shift the first power supply voltage VDDE (e.g., the I/O supply voltage) to a core supply voltage VDD, and the core supply voltage VDD is utilized as a supply voltage for operation of the transmission gates 26. The core supply voltage VDD may be, for example, a voltage within a range of about 1.6V to about 2V.

During operation, the LVDS receiver 10 utilizes relatively high currents and therefore consumes relatively high power. For example, assuming a tail current of I for each of the NMOS and PMOS differential pairs (e.g., as provided by the first and second current sources 16, 22), then the total current in the LVDS receiver 10 is equal to 4*I. This is because each of the load branches 18a, 18b receives or consumes a current equal to I, while each of the first and second current sources 16, 22 supplies or generates a current of I. This relatively large current may also introduce a large output common mode variation at the differential outputs 24a, 24b, which can only be reduced or minimized if the load current is increased with respect to the currents of the input differential pairs (e.g., the currents supplied by the first and second current sources 16, 22).

Figure 2:
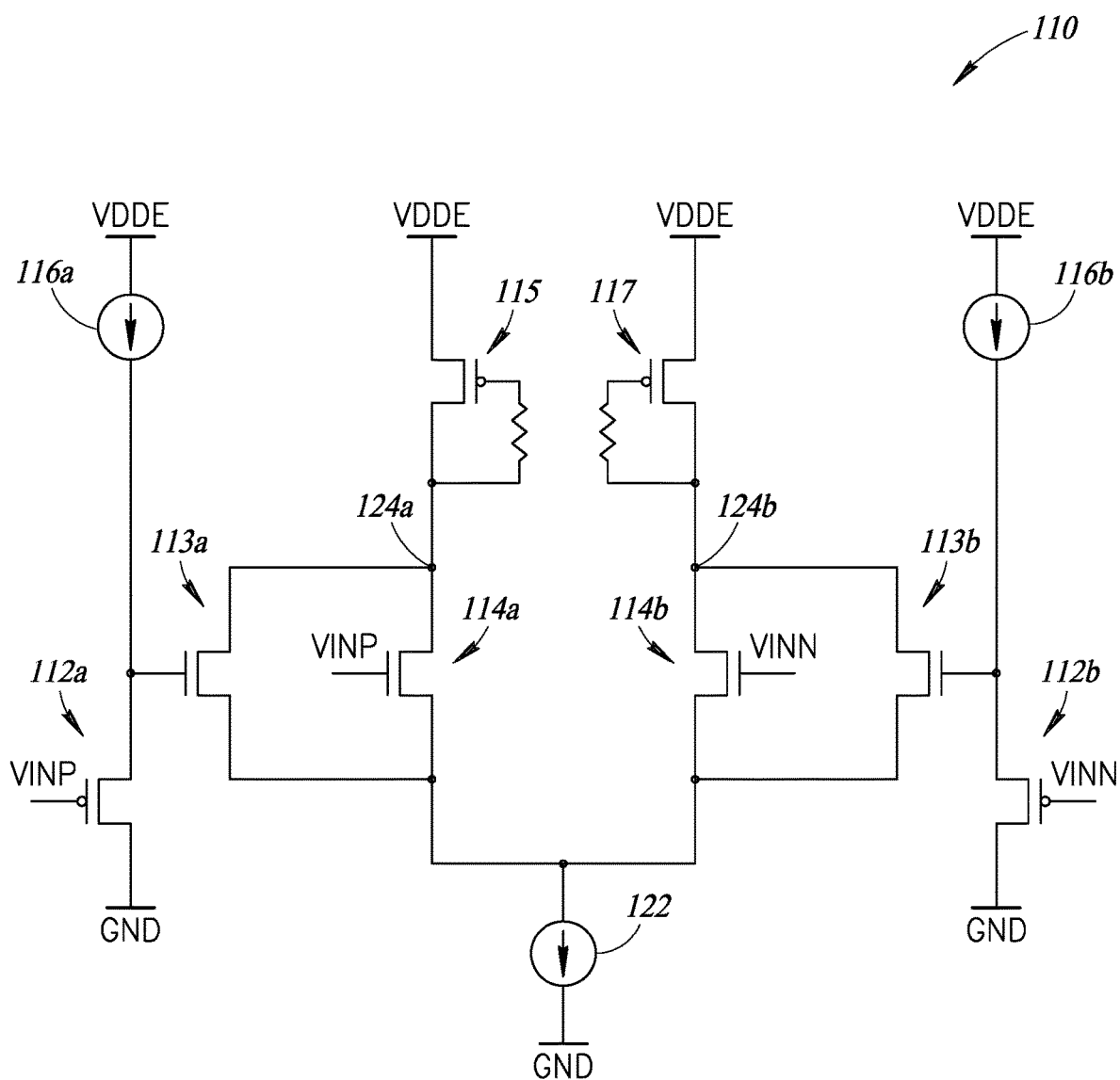
FIG. 2 is a schematic circuit diagram illustrating a first stage of a wide common mode low-voltage differential signaling (LVDS) receiver, in accordance with one or more embodiments.

FIG. 2 is a schematic circuit diagram illustrating a first stage of a wide common mode low-voltage differential signaling (LVDS) receiver 110, in accordance with one or more embodiments of the present disclosure.

The LVDS receiver 110 includes an NMOS differential pair including first and second NMOS transistors 114a, 114b, a pair of level shifters including first and second PMOS transistors 112a, 112b, and VINP and VINN are two differential inputs to the LVDS receiver 110.

The first differential input VINP is provided to gate terminals of the first NMOS transistor 114a and the first level shifter (e.g., the first PMOS transistor 112a), while the second differential input VINN is provided to gate terminals of the second NMOS transistor 114b and the second level shifter (e.g., the second PMOS transistor 112b). The first and second NMOS transistors 114a, 114b operate as differential input transistors of the LVDS receiver 110, as their gates are connected to the input signals VINP and VINN.

As will be described in further detail herein, the NMOS differential pair (i.e., the first and second NMOS transistors 114a, 114b) may be utilized when the differential inputs VINP, VINN are in a first range (e.g., corresponding to a higher range of input voltages or higher common mode voltages). Moreover, the first and second level shifters (e.g., the first and second PMOS transistors 112a, 112b) operate to level shift the differential input when the input voltage is in a second range (e.g., corresponding to a lower range of input voltages or lower common mode voltages), so that the NMOS differential pair (e.g., the first and second NMOS transistors 114a, 114b) may be used for both the first range (e.g., higher range) and the second range (e.g., lower range) of input voltages.

The LVDS receiver 110 includes a pair of first current sources 116a, 116b which are respectively coupled to the first and second level shifters. For example, as shown in FIG. 2, the current source 116a is coupled to the source terminal of the first PMOS transistor 112a, while the current source 116b is coupled to the source terminal of the second PMOS transistor 112b.

A pair of additional NMOS transistors is respectively coupled in parallel to the NMOS differential pair (e.g., the first and second NMOS transistors 114a, 114b). For example, as shown in FIG. 2, a first additional NMOS transistor 113a has a source terminal coupled to the source terminal of the first NMOS transistor 114a and a drain terminal of the first additional NMOS transistor 113a is coupled to the drain terminal of the first NMOS transistor 114a. The gate of the first additional NMOS transistor 113a is coupled to the first current source 116a and to the drain of the first PMOS transistor 112a.

A second additional NMOS transistor 113b has a source terminal coupled to the source terminal of the second NMOS transistor 114b and a drain terminal of the second additional NMOS transistor 113b is coupled to the drain terminal of the second NMOS transistor 114b. The gate of the second additional NMOS transistor 113b is coupled to the first current source 116b and to the drain of the second PMOS transistor 112b.

The source terminals of the first and second NMOS transistors 114a, 114b and the source terminals of the first and second additional NMOS transistors 113a, 113b are electrically coupled to a second current source 122.

A differential output is provided by the LVDS receiver 110 at the differential output nodes 124a, 124b. The output of the LVDS receiver 110 may be provided from the differential output nodes 124a, 124b to additional circuitry, which may be utilized to provide a full rail-to-rail signal based on the differential output.

Additional circuitry may be included in the LVDS receiver 110. For example, third and fourth PMOS transistors 115, 117 may be respectively coupled between the first power supply voltage VDDE and the differential output nodes 124a, 124b. Resistors may be coupled between gate and drain terminals of each of the third and fourth PMOS transistors 115, 117, as shown.

In operation, the second current source 122 provides a bias current to the first and second NMOS transistors 114a, 114b of the NMOS differential pair. The second current source 122 may be used to control the current flow for the NMOS differential pair. Similarly, the first current sources 116a, 116b provide bias currents to the first and second level shifters (e.g., the first and second PMOS transistors 112a, 112b).

When the differential inputs VINP, VINN are high (e.g., 2 V-4 V), the NMOS differential pair (i.e., the first and second NMOS transistors 114a, 114b) may be utilized, as the NMOS differential pair will be ON and the level shifters (e.g., the first and second PMOS transistors 112a, 112b) will be OFF.

When the differential inputs VINP, VINN are low, then the level shifters (e.g., the first and second PMOS transistors 112a, 112b) will be ON and the NMOS differential pair will be OFF. In this case, the first and second PMOS transistors 112a, 112b, which are configured as source followers, will provide source follower outputs to the gate terminals of the first and second additional NMOS transistors 113a, 113b. That is, the first and second PMOS transistors 112a, 112b level shift the output voltage and provide the level shifted voltage to the gates of the first and second additional NMOS transistors 113a, 113b. The level shifted voltage facilitates operation of the first and second additional NMOS transistors 113a, 113b for providing a differential output at the differential output nodes 124a, 124b when the differential inputs VINP, VINN are low.

The LVDS receiver 110 may therefore utilize the NMOS differential pair (e.g., the first and second NMOS transistors 114a, 114b) for a first range of input voltages (e.g., corresponding to a higher range of input voltages or higher common mode voltages), and the first and second additional NMOS transistors 113a, 113b may be utilized for a second range of input voltages (e.g., corresponding to a lower range of input voltages or lower common mode voltages), as the level shifters (e.g., the first and second PMOS transistors 112a, 112b) level shift an output voltage when operating at lower common mode voltages so that the output voltage may be used by the first and second additional NMOS transistors 113a, 113b to provide the differential output.

Accordingly, the LVDS receiver 110 can achieve a wide common mode input voltage range as the first and second NMOS transistors 114a, 114b are used for higher common mode voltage ranges and the first and second additional NMOS transistors 113a, 113b are used for lower common mode voltage ranges.

In comparison with the LVDS receiver 10 of the comparative example shown in FIG. 1, the LVDS receiver 110 shown in FIG. 2 provides several advantages. For example, the LVDS receiver 110 avoids the use of two complementary differential pairs (e.g., NMOS and PMOS differential pairs) and the associated load bias for such differential pairs. Instead, the LVDS receiver 110 uses the first and second NMOS transistors 114a, 114b for most of the input common range (e.g., for a first range corresponding to higher common mode voltages) and the first and second additional NMOS transistors 113a, 113b are used for partial input common mode range (e.g., for a second range corresponding to lower common mode voltages).

Further, load branches may be omitted in some embodiments of the LVDS receiver 110, as shown in FIG. 2, which results in reduced current consumption as compared with the LVDS receiver 10 of FIG. 1. Moreover, the first and second additional NMOS transistors 113a, 113b use the same tail current source (e.g., the second current source 122) as the NMOS differential pair (e.g., the first and second NMOS transistors 114a, 114b). The level shifters (e.g., the first and second PMOS transistors 112a, 112b) are turned off for the range of voltages where the main NMOS differential pair is functional (e.g., for the range of higher common mode voltages).

In an example, the LVDS receiver 110 of FIG. 2 may consume a total current of 120 µA, which includes 80 µA supplied or generated by the second current source 122 and 20 µA supplied or generated by each of the first current sources 116a, 116b. In contrast, the LVDS receiver 10 of FIG. 1 consumes a total current of 160 µA with lower performance than that of the LVDS receiver 110, as the total current of 160 µA includes 40 µA supplied or generated by each of the first and second current sources 16, 22, as well as 40 µA in each of the load branches 18a, 18b.

Since the second current source 122 of the LVDS receiver 110 supplies 80 µA of current for operation of the NMOS differential pair (e.g., the first and second NMOS transistors 114a, 114b) which is also used for operation of the first and second additional NMOS transistors 113a, 113b, the LVDS receiver 110 provides significantly increased functionality as compared to the 40 µA provided for operation of each of the complementary differential pairs (NMOS pair and PMOS pair) of the LVDS receiver 10 of FIG. 1. That is, even with a total current that is less than that of the LVDS receiver 10, the LVDS receiver 110 provides greater current for functioning of the input transistors, thereby facilitating increased performance with higher frequencies all while consuming less power than in the LVDS receiver 10 of FIG. 1.

In some embodiments, the first and second NMOS transistors 114a, 114b may have the same or substantially the same sizes and characteristics. Additionally, the first and second additional NMOS transistors 113a, 113b may have the same or substantially the same sizes and characteristics, and the first and second PMOS transistors 112a, 112b may have the same or substantially the same sizes and characteristics.

Figure 3:
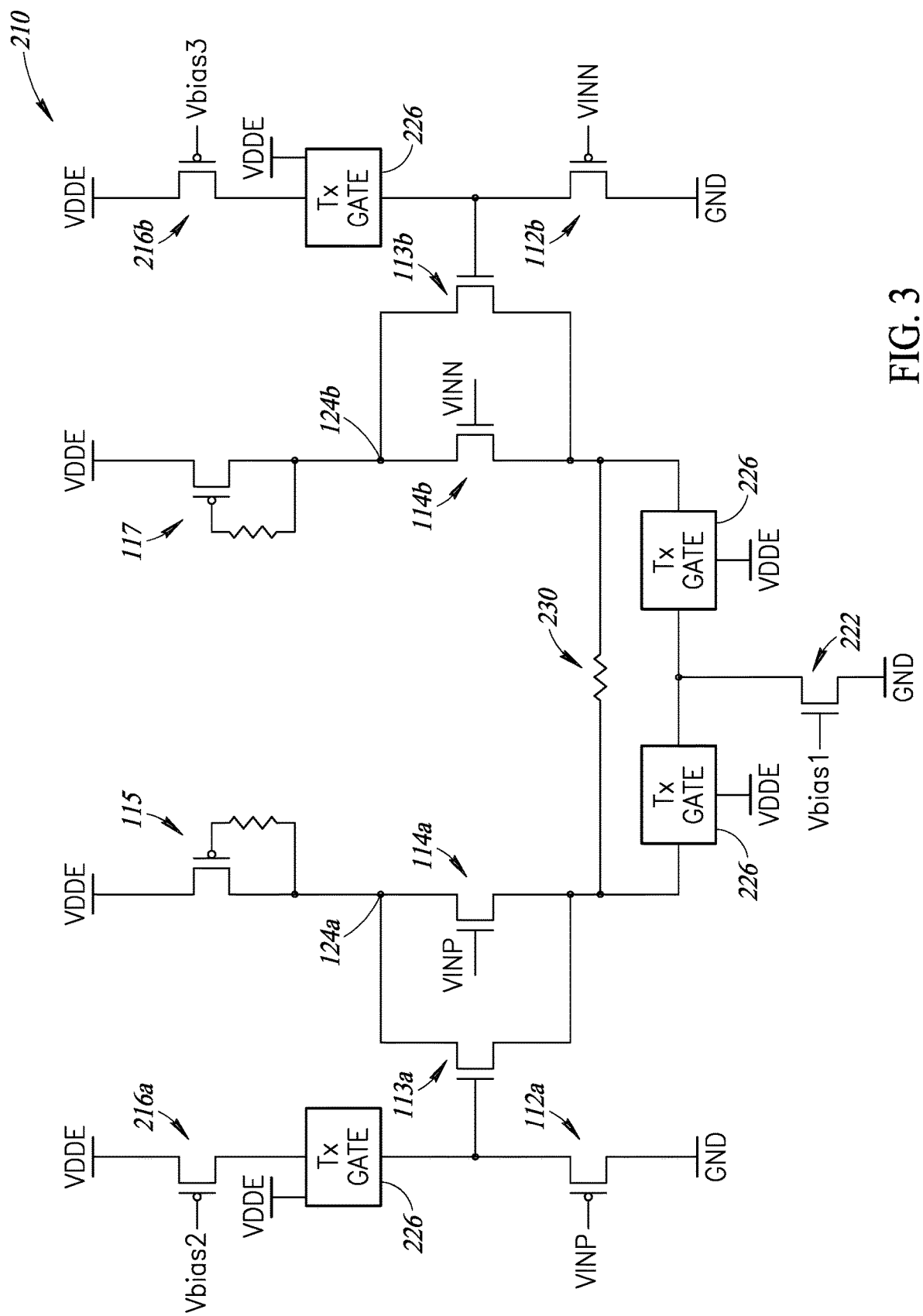
FIG. 3 is a schematic circuit diagram illustrating a first stage of a wide common mode low-voltage differential signaling (LVDS) receiver, in accordance with one or more embodiments.

FIG. 3 is a schematic circuit diagram illustrating a first stage of a wide common mode low-voltage differential signaling (LVDS) receiver 210, in accordance with one or more embodiments of the present disclosure. Many of the features of the LVDS receiver 210 shown in FIG. 3 are substantially the same as or similar to features of the LVDS receiver 110 shown and described with respect to FIG. 2.

One difference is that the first current sources 116a, 116b of the LVDS receiver 110 have been replaced with PMOS transistors 216a, 216b in the LVDS receiver 210 shown in FIG. 3. The source terminals of the PMOS transistors 216a, 216b are coupled to the first power supply voltage VDDE, and gate terminals of the PMOS transistors 216a, 216 be are respectively coupled to second and third bias voltages Vbias2, Vbias3. Accordingly, operation of the current sources provided by the PMOS transistors 216a, 216b may be controlled through application of the second and third bias voltages Vbias2, Vbias3. The bias voltages Vbias2, Vbias3 may be supplied, for example, from a bias generation circuit. In some embodiments, the second and third bias voltages Vbias2, Vbias3 may be the same, or they may be different from one another.

Transmission gates 226 may be coupled between the drain terminals of the PMOS transistors 216a, 216b and the level shifters (e.g., the source terminals of the first and second PMOS transistors 112a, 112b), as shown in FIG. 3.

Another difference is that the second current source 122 of the LVDS receiver 110 of FIG. 2 is replaced with an NMOS transistor 222 in the LVDS receiver 210 of FIG. 3.

The source terminal of the NMOS transistor 222 may be connected to a second power supply voltage GND, and the drain terminal of the NMOS transistor 222 may be electrically coupled to the source terminals of the NMOS differential pair (e.g., the first and second NMOS transistors 114a, 114b) and to the source terminals of the first and second additional NMOS transistors 113a, 113b, for example, through the transmission gates 226 as shown in FIG. 3. The gate of the NMOS transistor 222 may be coupled to a first bias voltage Vbias1, e.g., supplied from the bias generation circuit. The first bias voltage Vbias1 may be the same or different from the second and third bias voltages Vbias2, Vbias3 in various embodiments.

A resistor 230 may be coupled between the source terminals of the NMOS differential pair (e.g., the first and second NMOS transistors 114a, 114b), as shown in FIG. 3.

Operation of the LVDS receiver 210 is substantially the same as described herein with respect to operation of the LVDS receiver 110 shown in FIG. 2. For example, the second current source (e.g., the NMOS transistor 222) provides a bias current to the first and second NMOS transistors 114a, 114b of the NMOS differential pair in response to the first bias voltage Vbias1 applied to the gate of the NMOS transistor 222. The first current sources (e.g., the PMOS transistors 216a, 216b) provide bias currents to the level shifters (e.g., the first and second PMOS transistors 112a, 112b) in response to the second and third bias voltages applied to the gates of the PMOS transistors 216a, 216b.

The LVDS receiver 210 may utilize the NMOS differential pair (e.g., the first and second NMOS transistors 114a, 114b) for the first range of input voltages (e.g., corresponding to a higher range of input voltages or higher common mode voltages), and the first and second additional NMOS transistors 113a, 113b are utilized for the second range of input voltages (e.g., corresponding to a lower range of input voltages or lower common mode voltages), as the level shifters (e.g., the first and second PMOS transistors 112a, 112b) level shift an output voltage when operating at lower common mode voltages so that the output voltage may be used by the first and second additional NMOS transistors 113a, 113b to provide the differential output.

Accordingly, the LVDS receiver 210 can achieve a wide common mode input voltage range as the first and second NMOS transistors 114a, 114b are used for higher common mode voltage ranges and the first and second additional NMOS transistors 113a, 113b are used for lower common mode voltage ranges.

In contrast with the LVDS receiver 10 of the comparative example illustrated in FIG. 1, the transmission gates 226 of the LVDS receiver 210 may be operated with a supply voltage that is provided from the first power supply voltage VDDE (e.g., the I/O supply voltage). That is, a separate level shifter circuit for shifting the first power supply voltage VDDE to a core supply voltage VDD may be omitted in the LVDS receiver 210. This is because the PMOS differential pair (e.g., the PMOS transistors 12a, 12b) is omitted in the LVDS receiver 210, and thus the transmission gates 226 may be operated with a supply voltage provided at the level of the interface supply, i.e., the first power supply voltage VDDE.

FIG. 4A is a waveform diagram 410 illustrating performances of the LVDS receiver 10 of FIG. 1 and the LVDS receiver 210 of FIG. 3 at a first frequency, and FIG. 4B is a waveform diagram 420 illustrating performances of the LVDS receiver 10 of FIG. 1 and the LVDS receiver 210 of FIG. 3 at a second frequency.

As seen in FIG. 4A, a differential input signal 412 is provided to the LVDS receiver 10 and the LVDS receiver 210 at a first frequency. The first frequency in the example shown in FIG. 4A is 30 MHz. The differential input signal 412 represents a difference in the two differential inputs VINP and VINN provided to the LVDS receivers. That is, the differential input signal 412 equals VINP-VINN.

As can be seen in FIG. 4A, the output signal 402 of the LVDS receiver 210 of FIG. 3 is a higher quality signal than the output signal 401 of the LVDS receiver 10 of the comparative example illustrated in FIG. 1. In particular, the output signal 402 of the LVDS receiver 210 responds quicker to changes in the differential input signal 412 and has a waveform shape that more closely tracks the waveform shape of the differential input signal 412. In contrast, the output signal 401 of the LVDS receiver 10 lags farther behind the transitions of the differential input signal 412.

FIG. 4B is a waveform diagram 420 illustrating performances of the LVDS receiver 10 of FIG. 1 and the LVDS receiver 210 of FIG. 3 at a second frequency. The differential input signal 422 is provided to the LVDS receiver 10 and the LVDS receiver 210 at the second frequency, which is 60 MHz in the example shown in FIG. 4B.

As can be seen in FIG. 4B, the output signal 404 of the LVDS receiver 210 of FIG. 3 is a higher quality signal than the output signal 403 of the LVDS receiver 10 of the comparative example illustrated in FIG. 1. In particular, the output signal 404 of the LVDS receiver 210 responds quicker to changes in the differential input signal 412 and has a waveform shape that more closely tracks the waveform shape of the differential input signal 412. In contrast, the output signal 404 of the LVDS receiver 10 lags farther behind the transitions of the differential input signal 412. Further, the output signal 404 of the LVDS receiver 10 has a waveform shape which is quite different from the waveform shape of the differential input signal 412. For example, upper portions of the waveform of the output signal 404 are wider than corresponding upper portions of the waveform of the differential input signal 412. Thus, as illustrated by the waveform diagrams of FIGS. 4A and 4B, the LVDS receiver 210 provides improved performance, which is particularly apparent as the operating frequency (e.g., the frequency of the differential input signal) is increased. The LVDS receiver 210 further increases the bandwidth of the LVDS receiver circuit, as the LVDS receiver 210 is capable of operating at a wider range of frequencies and at higher frequencies than the LVDS receiver 10.

Figure 5:
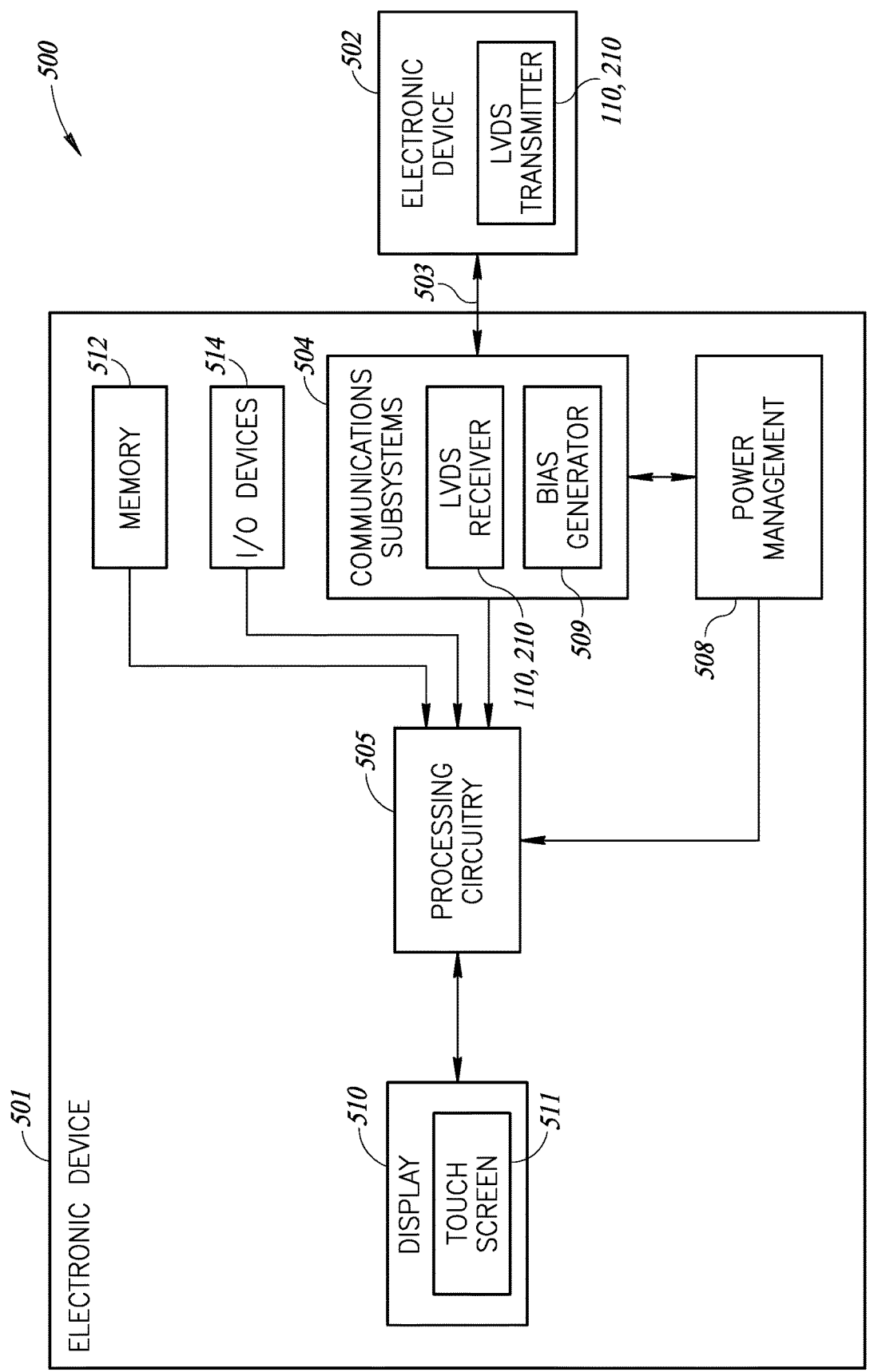
FIG. 5 is a block diagram illustrating an electronic system including electronic devices having an LVDS receiver, in accordance with one or more embodiments of the present disclosure.

FIG. 5 is a block diagram illustrating an electronic system 500 in accordance with one or more embodiments of the present disclosure.

As shown in FIG. 5, the electronic system 500 includes first and second electronic devices 501, 502, each of which includes one or more of the LVDS receivers and/or transmitters 110, 210 of FIGS. 2 and 3. The electronic devices 301, 302 are communicatively coupled to one another through a communications link 503, which may be or implement any communications network or protocol suitable for LVDS communications. In some embodiments, the communications link 503 may be a twisted pair copper cable or a coaxial cable.

The LVDS receivers and/or transmitters 110, 210 of the first and second electronic devices 501, 502 facilitate communication of information between the electronic devices 501, 502. In some embodiments, the LVDS receivers and/or transmitters 110, 210 of either or both of the first and second electronic devices 501, 502 may be utilized for communications between electronic components within the first or second electronic devices 501, 502.

The first electronic device 501 may include processing circuitry 505 that controls the overall operation of the electronic device 501 and also executes one or more applications that provide specific functionality for a user of the electronic device 501. The electronic device 501 may be any type of electronic device, such as a smart phone, laptop or tablet computer, television or display device, camera device, a wearable computing device, a vehicle or automotive computing device, a robotic machine, and so on. In the example embodiment of FIG. 5, the electronic device 501 includes a power management subsystem 508 coupled to the processing circuitry 505, and the power management subsystem 508 may include one or more power sources such as a battery or the like for powering the electronic device 501 and also control circuitry for controlling power-related operating modes of the electronic device 501 such as charging of the battery, power-saving modes, and so on.

The electronic device 501 may further include a display 510, such as a liquid crystal display (LCD) or the like. The display 510 may include or otherwise be used in conjunction with a touch screen 511, which may be a touch panel or touch sensing circuitry attached to or formed as an integral part of the display 511. In operation, the touch screen 511 senses touches of a user of the electronic device 501 and provides sensed touch information to the processing circuitry 505 to thereby allow the user to interface with and control the operation of the electronic device 501. The processing circuitry 505 may also control the display 510 to display desired visual content.

The electronic device 501 may further include memory 512 communicatively coupled to the processing circuitry 505 for storing and retrieving data, such as software executed by the processing circuitry 505 and utilized by the electronic device 501 during operation. The memory 512 may be any computer-readable storage medium, and in some embodiments, the memory 512 may include solid state memory such as DRAM, SRAM and FLASH, solid state drives (SSDs), phase change RAM (PCRAM), and may include any other type of memory suited to the desired functionality of the electronic device 501.

The electronic device 501 may further include one or more input devices and output devices (collectively, I/O devices 514) which are communicatively coupled to the processing circuitry 505. The I/O devices 514 may include any input or output devices depending for example on a particular application or type of the electronic device 501, and in some embodiments may include a keypad, accelerometer, microphone, mouse, digital camera to capture still and video images, audio output devices such as a speaker, printer, vibration device, and so on.

The electronic device 501 may further include communications subsystems 504 communicatively coupled to the processing circuitry 505, and the communications subsystems 504 may include or otherwise implement the LVDS receiver 110, 210. In some embodiments, the communications subsystems 504 may include other additional types of communication circuitry, such as Wi-Fi, GPS, cellular and Bluetooth circuitry for providing the electronic device 501 with the corresponding functionality. The specific type and number of I/O devices 514, communications subsystems 504, and even the specific functionality of the power management subsystem 508 will of course depend on the type of the electronic device 501, which may be any suitable type of electronic device.

The communications subsystems 504 may further include a bias generator 509, which may be any circuitry configured to generate bias voltages, such as the bias voltages Vbias1, Vbias2, Vbias3 previously described herein. The bias generator 509 may be electrically coupled to the LVDS receiver 110, 210 and may generate the bias voltages and supply the bias voltages to the LVDS receiver 110, 210 for operating or controlling the current sources of the LVDS receiver. The bias generator 509 may be electrically coupled to the power management subsystem 508 which may provide operating power or voltage for generating the bias voltages.

The second electronic device 502 may be the same or different from the first electronic device 501. That is, the second electronic device 502 may include the same features as described above with respect to the first electronic device 501, or in some embodiments, the second electronic device 502 may include different circuitry, components, features or the like and may be a different type of device than the first electronic device 501. As shown in FIG. 5, however, the second electronic device 502 includes an LVDS receiver and/or transmitter 110, 210 which may facilitate LVDS communications between the first and second electronic devices 501, 502.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low-voltage differential signaling (LVDS) receiver, comprising:
   an input differential pair of transistors configured to receive a differential input signal, the input differential pair including:
      a first NMOS transistor configured to receive a first input signal of the differential input signal; and
      a second NMOS transistor configured to receive a second input signal of the differential input signal;
   a third NMOS transistor having a source terminal coupled to a source terminal of the first NMOS transistor, the third NMOS transistor having a drain terminal coupled to a drain terminal of the first NMOS transistor;
   a fourth NMOS transistor having a source terminal coupled to a source terminal of the second NMOS transistor, the fourth NMOS transistor having a drain terminal coupled to a drain terminal of the second NMOS transistor;
   a first level shifter coupled to a gate of the third NMOS transistor, the first level shifter having a control input configured to receive the first input signal; and
   a second level shifter coupled to a gate of the fourth NMOS transistor.

2. The LVDS receiver of claim 1 wherein the first level shifter comprises a first PMOS transistor, and the second level shifter comprises a second PMOS transistor.

3. The LVDS receiver of claim 2, further comprising:
   a first current source coupled between a first supply voltage and the source terminals of the first and second NMOS transistors.

4. The LVDS receiver of claim 3 wherein the first current source comprises a fifth NMOS transistor.

5. The LVDS receiver of claim 3, further comprising:
   a second current source coupled between a second supply voltage and a source terminal of the first PMOS transistor; and a third current source coupled between the second supply voltage and a source terminal of the second PMOS transistor.

6. The LVDS receiver of claim 5 wherein the second current source comprises a third PMOS transistor, and the third current source comprises a fourth PMOS transistor.

7. The LVDS receiver of claim 6, further comprising:
a first transmission gate electrically coupled between the first PMOS transistor and the third PMOS transistor; and
a second transmission gate electrically coupled between the second PMOS transistor and the fourth PMOS transistor.

8. The LVDS receiver of claim 7 wherein each of the first and the second transmission gates are electrically coupled to a third supply voltage, the third supply voltage configured to control an operation of the first and second transmission gates, the third supply voltage being a voltage level that is between voltage levels of the first and the second supply voltages.

9. The LVDS receiver of claim 8 wherein the first supply voltage is a ground voltage, the second supply voltage is an interface supply voltage, and the third supply voltage is a core supply voltage.

10. The LVDS receiver of claim 1 wherein, in use, the first and second NMOS transistors are turned on and the first and second level shifters are turned off in response to the differential input signal being in a first range of input voltages, and the first and second NMOS transistors are turned off and the first and second level shifters are turned on in response to the differential input signal being in a second range of input voltages that is different from the first range.

11. The LVDS receiver of claim 10 wherein the input voltages of the first range are greater than the input voltages of the second range.

12. An electronic device, comprising:
processing circuitry; and
a low-voltage differential signaling (LVDS) receiver electrically coupled to the processing circuitry, the LVDS receiver comprising:
an input differential pair of NMOS transistors configured to receive a differential input signal, the input differential pair including:
a first NMOS transistor configured to receive a first input signal of the differential input signal; and
a second NMOS transistor configured to receive a second input signal of the differential input signal;
an additional pair of NMOS transistors respectively electrically coupled in parallel with the input differential pair of NMOS transistors; and
a pair of level shifters respectively coupled to gate terminals of the additional pair of NMOS transistors, the pair of level shifters having control inputs configured to receive the differential input signal.

13. The electronic device of claim 12 wherein the pair of level shifters includes a first PMOS transistor having a gate terminal configured to receive the first input signal of the differential input signal, and a second PMOS transistor having a gate terminal configured to receive the second input signal of the differential input signal.

14. The electronic device of claim 13 wherein, in use, the first and second NMOS transistors of the input differential pair are turned on and the first and second PMOS transistors are turned off in response to the differential input signal being in a first range of input voltages, and the first and second NMOS transistors of the input differential pair are turned off and the first and second PMOS transistors are turned on in response to the differential input signal being in a second range of input voltages that is different from the first range.

15. The electronic device of claim 14 wherein the input voltages of the first range are greater than the input voltages of the second range.

16. The electronic device of claim 12, further comprising:
a first current source electrically coupled between a first supply voltage and source terminals of the first and second NMOS transistors of the input differential pair;
a second current source electrically coupled between a second supply voltage and the first level shifter; and
a third current source electrically coupled between the second supply voltage and the second level shifter,
wherein the second supply voltage is greater than the first supply voltage.

17. The electronic device of claim 16, further comprising:
bias generation circuitry electrically coupled to the LVDS receiver, the bias generation circuitry configured to supply respective bias voltages to the LVDS receiver for operation of the first, second, and third current sources.

18. The electronic device of claim 12 wherein the electronic device is at least one of a smartphone, a tablet or laptop computer device, a display device, a camera, a wearable computing device, an automotive computing device, or a robotic machine.

19. A method of manufacturing a low-voltage differential signaling (LVDS) receiver having an input differential pair of transistors configured to receive a differential input signal, the method comprising:
electrically coupling a source terminal of a first NMOS transistor of the input differential pair to a source terminal of a third NMOS transistor, the first NMOS transistor configured to receive a first input signal of the differential input signal;
electrically coupling a drain terminal of the first NMOS transistor of the input differential pair to a drain terminal of the third NMOS transistor;
electrically coupling a source terminal of a second NMOS transistor of the input differential pair to a source terminal of a fourth NMOS transistor, the second NMOS transistor configured to receive a second input signal of the differential input signal;
electrically coupling a drain terminal of the second NMOS transistor of the input differential pair to a drain terminal of the fourth NMOS transistor;
electrically coupling a first PMOS transistor between a first supply voltage and a gate terminal of the third NMOS transistor, the first PMOS transistor having a control input configured to receive the first input signal; and
electrically coupling a second PMOS transistor between the first supply voltage and a gate terminal of the fourth NMOS transistor.

20. The method of claim 19, further comprising:
electrically coupling a first current source between the first supply voltage and the source terminals of the first, second, third, and fourth NMOS transistors;
electrically coupling a second current source between a second supply voltage and the gate terminal of the third NMOS transistor; and
electrically coupling a third current source between the second supply voltage and the gate terminal of the fourth NMOS transistor, wherein the second supply voltage is greater than the first supply voltage.

* * * * *